(12) United States Patent
Flake

(10) Patent No.: US 7,989,347 B2
(45) Date of Patent: Aug. 2, 2011

(54) PROCESS FOR FILLING RECESSED FEATURES IN A DIELECTRIC SUBSTRATE

(75) Inventor: John C. Flake, Montbonnot (FR)

(73) Assignee: Freescale Semiconductor, Inc., Austin, TX (US)

( * ) Notice: Subject to any disclaimer, the term of this patent is extended or adjusted under 35 U.S.C. 154(b) by 338 days.

(21) Appl. No.: 12/295,465

(22) PCT Filed: Mar. 30, 2006

(86) PCT No.: PCT/EP2006/003970
§ 371 (c)(1),
(2), (4) Date: Sep. 30, 2008

(87) PCT Pub. No.: WO2007/112768
PCT Pub. Date: Oct. 11, 2007

(65) Prior Publication Data
US 2009/0170306 A1    Jul. 2, 2009

(51) Int. Cl.
*H01L 21/44*    (2006.01)
(52) U.S. Cl. ........ 438/678; 438/637; 438/638; 438/672; 438/673; 206/123; 206/157; 206/291

(58) Field of Classification Search .......... 438/637–638, 438/672–673, 618–624, 678; 205/118–122, 205/215, 296
See application file for complete search history.

(56) References Cited

U.S. PATENT DOCUMENTS

| | | | |
|---|---|---|---|
| 6,214,193 B1 | 4/2001 | Reid et al. | |
| 6,491,806 B1 | 12/2002 | Dubin et al. | |
| 6,555,170 B2 | 4/2003 | Taylor | |
| 6,858,121 B2 | 2/2005 | Basol | |
| 2001/0015321 A1* | 8/2001 | Reid et al. | 205/103 |
| 2002/0105090 A1* | 8/2002 | Tonomura et al. | 257/774 |
| 2002/0175080 A1 | 11/2002 | Teerlinck et al. | |
| 2004/0118697 A1 | 6/2004 | Wen et al. | |
| 2004/0154926 A1 | 8/2004 | Sun et al. | |
| 2004/0195106 A1* | 10/2004 | Mishima et al. | 205/137 |
| 2005/0164495 A1 | 7/2005 | Chou et al. | |

* cited by examiner

*Primary Examiner* — Dung A. Le

(57) ABSTRACT

A process for filling recessed features of a dielectric substrate for a semiconductor device, comprises the steps (a) providing a dielectric substrate having a recessed feature in a surface thereof, wherein the smallest dimension (width) across said feature is less than ≦200 nm, a conductive layer being present on at least a portion of said surface, (b) filling said recessed feature with a conductive material, and (c) prior to filling said recessed feature with said conductive material, treating said surface with an accelerator.

21 Claims, 3 Drawing Sheets

PROCESS FOR FILLING RECESSED FEATURES IN A DIELECTRIC SUBSTRATE

TECHNICAL FIELD

The present invention relates to a process for filling recessed features in a dielectric substrate, the substrate being suitable for the production of a semiconductor device.

BACKGROUND

Semiconductor manufacturers are continuously striving to produce faster and more complex integrated circuits. One way to achieve this is to reduce the dimensions of the semiconductor circuits, thereby decreasing the gate (transistor) delay. However, as the dimensions of the circuits are reduced, the physical properties of the materials making up the circuits become increasingly important. In particular, as the size of the conducting interconnects contained in the circuit, and more particularly their width, decreases, the electrical resistance of the interconnect is proportionately increased. This causes an increased interconnect time delay. Until recently, aluminium had been traditionally used to manufacture these interconnects. However, in order to combat the problems associated with the reduction in the circuit dimensions, semiconductor manufacturers have decided that copper provides better material characteristics than aluminium for use in interconnects because of its lower bulk resistivity, higher heat conductivity and higher melting point, which results in improved speed and reliability performance. In addition, copper also has lower rate of grain boundary diffusion, and therefore higher electromigration resistance.

In order to provide conducting interconnects between and within layers of a semiconductor device, a method sometimes termed a "damascene" process has been developed. This process first involves deposition of a dielectric layer, lithography and then etching of the dielectric layer to form vias and/or trenches in the layer. A barrier layer such as Ta is first deposited (typically via physical vapour deposition or atomic layer deposition) in the trenches followed by a thin seed layer. The seed layer may also be deposited by physical vapour deposition, chemical vapour deposition or atomic layer deposition. The seed layer is a conducting layer that allows electrodeposition to occur and typically comprises copper or a copper alloy such as CuAl. The substrate is then subjected to an electroplating (electrodeposition) process in order to fill the recessed trenches and vias with copper. The electroplating may continue until all of the recessed features are filled, which may involve continuing with electrodeposition until an overburden is formed (a layer on the surface of the substrate typically less than 2 microns thick). The overburden may be removed using a process such as chemical mechanical polishing.

It is known to use a pre-rinse step after the deposition of a seed layer and before electrodeposition of the copper, which is simply to clean the surface of the substrate and to remove contaminants, which may result in defect formation. Generally, the dielectric substrate is pre-rinsed with deionised or distilled water. Such a process is disclosed in U.S. Pat. No. 6,491,806 B1.

Researchers have found that, for increasingly narrow vias (having a diameter less than 200 nm), there is an increased likelihood of defect formation in the copper interconnects when they are filled during electrodeposition. This is due to the way the copper is deposited onto the surfaces in and around recessed features during electrodeposition. During 'normal' electrodeposition (in which no organic additives are present in the electrolyte solution) onto a seeded dielectric substrate, it has been found a metal will deposit more quickly around the top edges of a via or trench compared to the bottom. The increased amount of copper deposition on the sides around the rim of a recessed feature can lead to a cavity forming in the copper as the electrodeposition progresses. This increased deposition around the rim of a recessed feature is due to two factors: (i) the transport of copper ions to the top of recessed feature is greater than to the bottom of recessed feature, largely due to diffusion, and (ii) there is higher electric field around the rim due to its closer proximity to the anode.

Alternatively, the recessed feature may be filled 'conformally', i.e. the metal deposition follows the conformation of recessed structure. This can lead to a vertical thin seam forming at the centre of recessed structure, which is undesirable. This seam can interfere with copper recrystallization and may trap electrolyte. It has been found that an excess of a suppressor in the electrolyte solution seems to promote this conformal filling.

With large recessed features (width>1 micron) 'normal' and 'conformal' deposition do not tend to result in defect formation, so the nature of the deposition was not so much of a concern for the filling these larger recessed features.

The most desirable way in which a narrow recessed feature is filled is in a 'bottom-up' or 'superconformal' manner, i.e. where the conductive material is deposited significantly faster at the bottom of the feature than on its side walls. Recent advances have provided deposition processes in which the filling of vias is in a superconformal manner. This generally involves using a combination of additives in the electrolyte solution, such as a organic polyether "suppressor" additive (such as PEG or copolymers of PEO/PPO), in combination with a smaller organic thiolate molecule "accelerator" additive (such as SPS).

The adsorption and incorporation behaviour of the adsorbed suppressor and accelerator molecule are unique. The thiolate accelerator, for instance, tends to float at the surface undergoing deposition while the suppressor may be displaced or incorporated into the electrodeposited copper. The difference in adsorption causes the floating thiolates to crowd together in the bottom of recessed structures. As a result of thiolate crowding at the bottom of recessed structures, the local deposition rate is increased (or accelerated) and bottom-up or superconformal filling is realized.

A "suppressor" is defined as a species that can adsorb on to the surface of a conductive material (for example a metal such as copper or an alloy thereof) and decreases the rate of electrodeposition of a metal (for example copper or an alloy thereof) on to the surface (on which the suppressor is adsorbed) compared to electrodeposition under the same conditions but in which no suppressor is present. Typical examples of suppressor polyethers are polyethylene glycol (PEG), polypropylene glycol (PPG) and block copolymers of polyethylene oxide and polypropylene oxide. Molecular weights of the suppressors may range from 500 to 20000 g/mol.

An "accelerator" (which is sometimes referred to in the art as a brightener or an anti-suppressor) is defined as a species that can adsorb on to the surface of a conductive material (for example a metal such as copper or an alloy thereof) and increases the rate of electrodeposition of a metal (for example copper or an alloy thereof) on to the surface (on which the accelerator is adsorbed) compared to electrodeposition under the same conditions but in which no accelerator is present. Typically, accelerators are sulphur-containing thiolates such as SPS (bis(3-sulfopropyl)-disodium-sulfoxide).

Accelerators and suppressors are known to those skilled in the art.

The present inventors have found that in electrodeposition processes in which superconformal filling occurs (e.g. using electrolytes containing accelerators and suppressors), there is still usually an initial stage where deposition onto the seed layer is conformal. There is a desire to reduce or eliminate this initial conformal filling since excessive conformal deposition results in voids.

SUMMARY OF THE INVENTION

Accordingly, the present invention provides a process as described in claim 1 for filling recessed features of a dielectric substrate for a semiconductor device, the process comprising the steps:

(a) providing a dielectric substrate having a recessed feature in a surface thereof, wherein the smallest dimension across said feature is $\leq 200$ nm, a conductive layer being present on at least a portion of said surface, and (b) filling said recessed feature with a conductive material, characterised in that the process further comprises (c) prior to filling said recessed feature with said conductive material, treating said surface with an accelerator.

Optional features of the invention are further described in the accompanying dependent claims.

Figure 1:
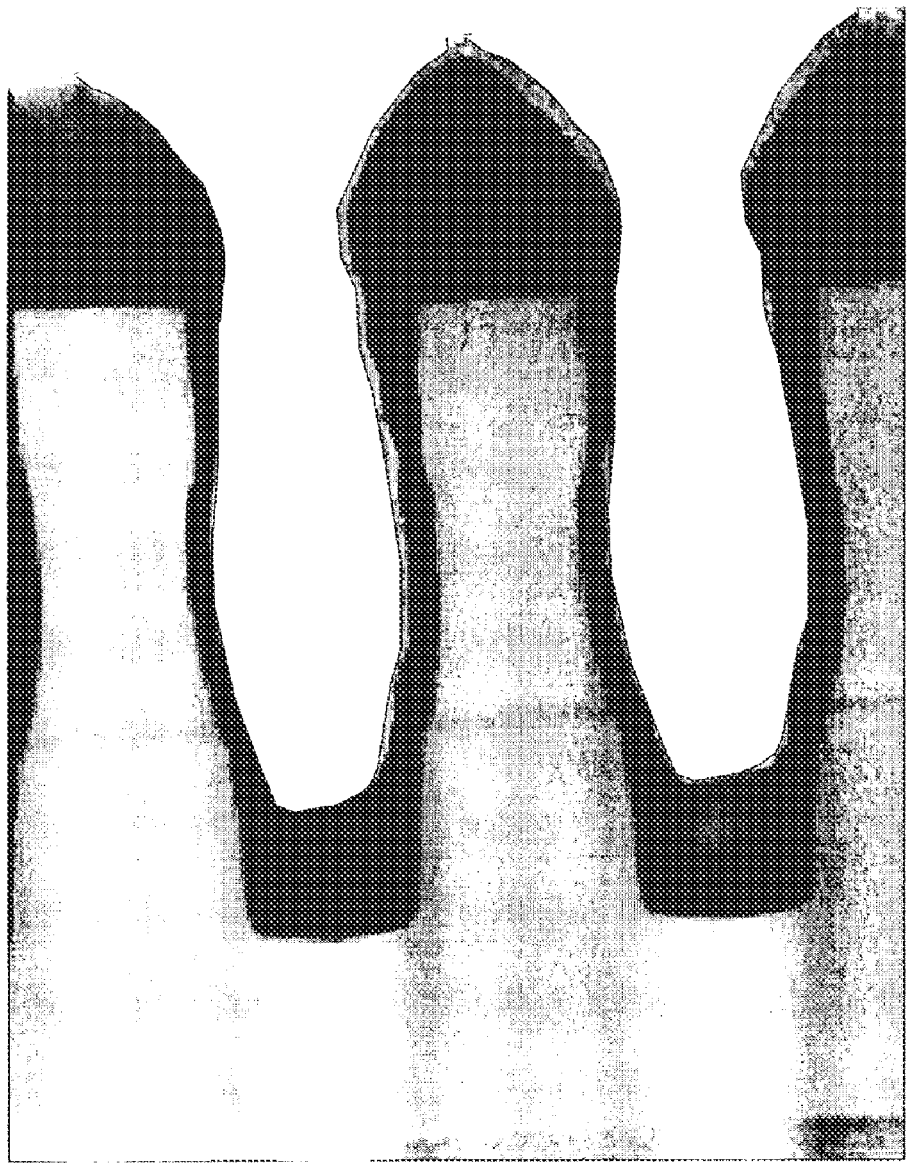
FIG. 1 (prior art) shows an cross-section (TEM) image of several trenches following PVD barrier and seed deposition. The thickness of the deposited copper on the vertical sides near the aperture of the trench is greater than the thickness of the deposited copper at approximately mid way up the side of the trench. If the electrodeposited film were to be deposited in a conformal or 'normal' mode it is likely that a void or cavity would be formed in the deposited copper.
Figure 2:
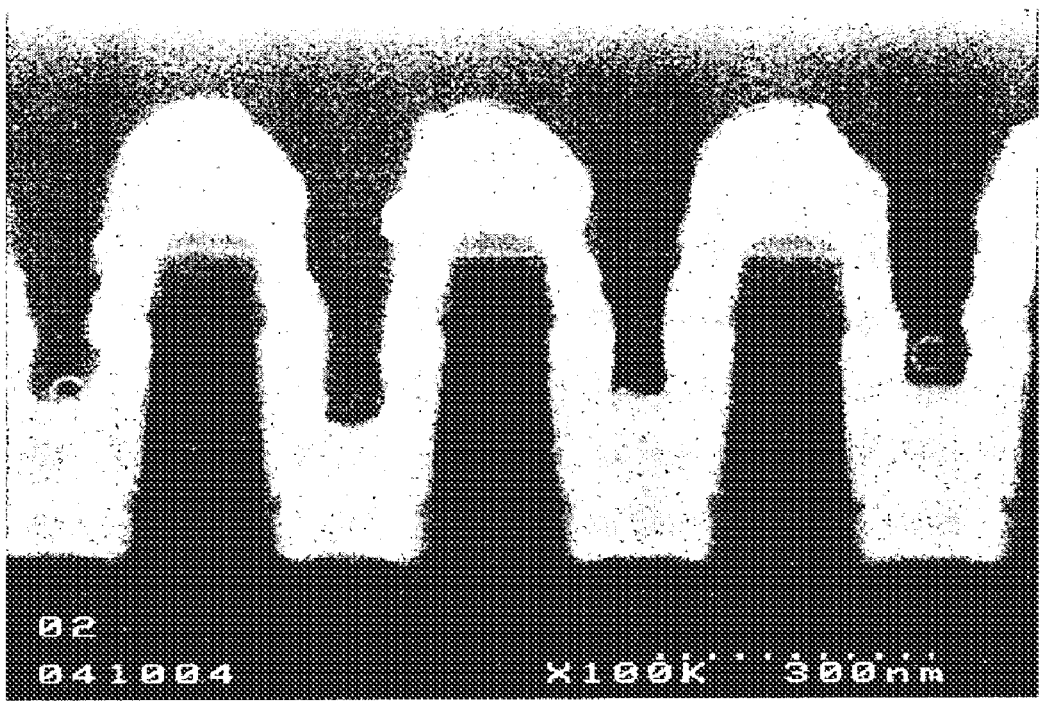
FIG. 2 (prior art) shows a cross-section (SEM) of a partially filled trenches following initial 'conformal' deposition of copper. It can be seen that the layer of copper approximately conforms with the contours of the trenches. A small amount of superconformal filling has occurred, since the depth of the deposited copper layer is more than the depth on the sides of the trenches.
Figure 3:
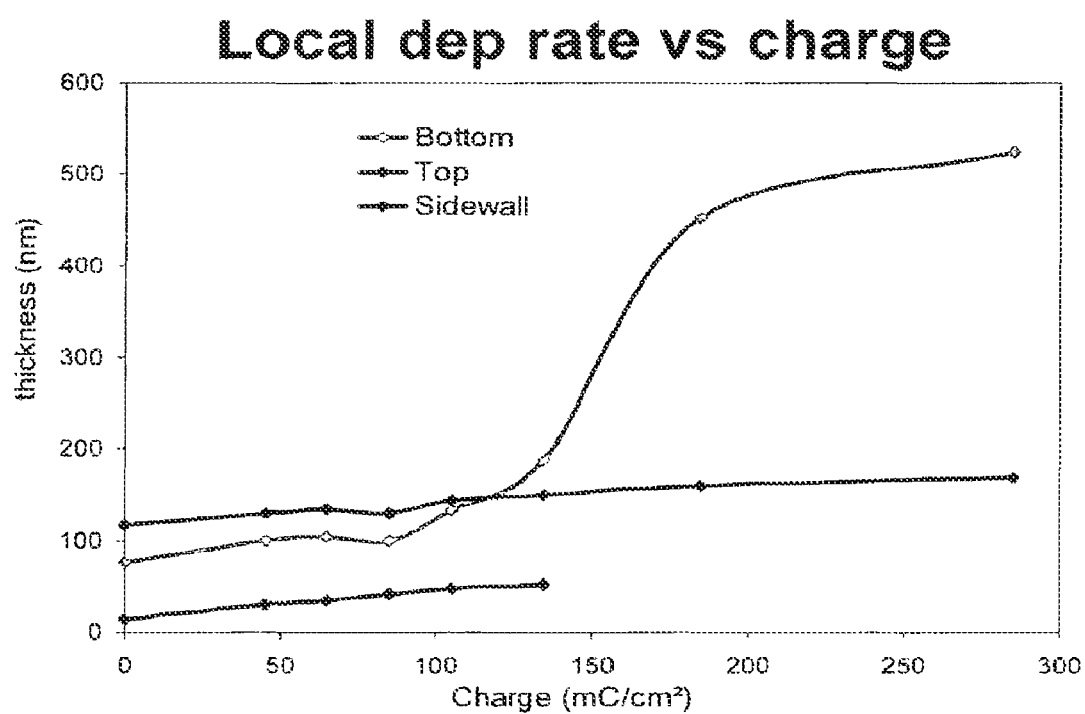
FIG. 3 (prior art) shows a graph of the depth of deposited copper on various parts of the substrate illustrated in FIG. 2 vs. the charge density (which increases over time at the beginning of an electrodeposition process). From approximately 0 to 90 $mC/cm^2$, the rates of filling on the sidewalls and bottom of recessed feature are approximately the same and thus result in an initial conformal filling. At approximately 90 $mC/cm^2$ in this case, the rate of filling at the bottom of recessed feature increases substantially, while the rate of filling on the sidewalls does not alter to a great extent. From approximately 90 $mC/cm^2$, the filling becomes superconformal. Use of the process of the present invention shortens the time at which superconformal occurs, i.e. it occurs at less than 90 $mC/cm^2$.

The application of electrochemical deposition to fill deep features with narrow apertures is limited mainly by the initial conformal deposition. While electrochemical deposition with accelerators and suppressors has been demonstrated to fill recessed features with apertures of about than 70 nm and aspect ratios of about 4:1 (with some defect formation), the extension of this process to smaller apertures or higher aspect ratios is limited. The process of the present invention may be used to fill recessed features of less than 70 nm (at the smallest dimension across the feature) and/or having an aspect ratio (height:width) of 4:1 or more.

"Recessed feature" includes, but is not limited to, a trench and/or a via. A trench is a recessed feature that has a length along the surface of the substrate greater than its width (also measured along the surface of a substrate). A trench typically does not extend through a dielectric layer in a substrate. A via is a hole that extends though one or more layers of a dielectric substrate suitable for use, when filled with conducting material, for interconnection of conductors located at both ends of the via (on different sides of the layer(s)). The dielectric substrate will typically comprise a plurality of recessed features, such as vias and/or trenches. The diameter across a recessed feature may be 150 nm or less, 100 nm or less, 70 nm or less or 45 nm or less. The "diameter" is the smallest dimension across the recessed feature. For a trench, which is a recessed feature having a length greater than its width, the diameter is measured along its width.

The recessed feature(s) may have substantially parallel sides or have sides with another orientation, such as sides which taper outwards or inwards towards the opening of the recessed feature, or sides forming a 'bottle-shaped' recessed feature. The smallest dimension across the recessed feature is therefore not necessarily at either the opening or base of the feature, but depends on the shape of the feature.

It has been found that when a semiconductor substrate having one or more recessed features and a seed layer on its surface is contacted with an electrolyte containing suppressor and accelerator additives, the deposition undergoes a transient period where several phenomena occur simultaneously: electrode charging, suppressor and accelerator transport, and adsorption. The suppressor additives interact with chloride ions and often adsorb on to the surface faster than the accelerator additives. Therefore, if electrodeposition is initiated before the accelerator has adsorbed within the recessed feature, the filling of the recessed feature remains conformal for an extended time. One solution to this problem would be to wait until the accelerator has adsorbed within the recessed feature, but this would risk corrosion/etching of the seed layer and slow down the processing time of the substrate, since it may take many minutes to reach a steady state of adsorption. The present inventors have surprisingly found that by treating the substrate with an accelerator prior to filling the recessed feature, the initial conformal filling is reduced, if not eliminated, and hence the number of defects in the filled recessed feature is reduced. There is also therefore less of a need (if any) to delay the initiation of the electrodeposition once the substrate has contacted the electrolyte solution.

The surface may be treated with an accelerator by contacting the surface with a liquid containing the accelerator (herein termed a "treatment liquid"). This treatment liquid is different from the electrolyte solution with which the surface is contacted for the electrodeposition. At least some or all of the accelerator in the liquid may be in solution. The liquid may comprise water, which may be distilled and/or deionised water. The water may also be de-oxygenated or de-ozonated to remove oxidizing agents.

The surface may be treated by spraying the treatment liquid onto the surface of the substrate. The treatment liquid may be sprayed onto the substrate via a nozzle.

The surface of the dielectric substrate may be in a face-up or face-down position during contact with the treatment liquid. The surface of the substrate may be purged with deionised water following contact with the treatment liquid and the substrate then subjected to electrodeposition.

The treatment of the surface with the accelerator may follow repair of the conductive layer (e.g. seed layer) or electrodeposition of the conductive layer.

After contacting the treatment liquid with the surface, at least some of the treatment liquid may be allowed to remain within the recessed feature(s) prior to filling the recessed feature(s), which is typically by an electrodeposition process. The treatment liquid is optionally not removed from the surface, for example removing the treatment liquid by flushing with another liquid, allowing the treatment liquid to evaporate and/or subjecting the substrate to a drying process. After contacting the treatment liquid with the surface of the substrate, electrodeposition may be carried out immediately afterwards (which may be within 30 seconds of contact with the treatment liquid, more preferably within 15 seconds of contact with the treatment liquid).

It has been found by the present inventors that if the surface of the substrate remains wet between treating the surface with the treatment liquid and the filling step, the treatment liquid remains in the recessed features. Thus, on contacting the surface with an electrolyte solution, transport of suppressor species from the electrolyte solution to the surface is diffusion controlled. Diffusion of the suppressor species from the bulk electrolyte solution to the areas within the recessed features (particularly the bottom of the feature) is slower compared to the diffusion of the suppressor to the surface of the substrate surrounding the recessed feature. The combination of (i) adsorbing an accelerator onto the surface of the substrate prior to electrodeposition, and (ii) allowing the treatment solution to remain in contact with the surface of the substrate promotes superconformal filling of the recessed feature and reduces or eliminates the initial conformal filling.

The treatment liquid may contain ions of the conductive material in solution, which may be metal ions, for example copper ions. This has been surprisingly found to promote superconformal filling, especially in the process described above in which the treatment liquid is not removed from the substrate prior to electrodeposition. It is believed that the fill behaviour is improved because there is no mass transfer limitation of ions to the surfaces within recessed structure in the initial deposition step.

The treatment liquid may contain a copper compound, which may be a soluble copper compound such as, for example, copper sulphate.

The treatment liquid may contain one or more complexing agents which can complex to the ions of the conductive material in solution. The treatment solution may contain EDTA or pyrophosphate. These have been found to assist in the solution of metal ions, especially copper ions, in water in the pH range between 6-12. The complexing agent may comprise an organic acid or a salt thereof. The organic acid may comprise ethanoic acid or a salt thereof such as an alkali metal (e.g. Li, Na, K) ethanoate.

If the treatment liquid contains ions of the conductive material and has a pH in the neutral (about pH 7) or mildly basic range (above pH 7, up to and including pH 12), the treatment solution may contain one or more complexing agents.

The treatment liquid may be acidic or basic. This may improve the solubility of the ions of the conductive material. The treatment liquid may comprise sulphuric acid or ammonium hydroxide.

The accelerator may comprise an organic compound containing sulphur. The accelerator may comprise one or more of a disulfide, a mercaptan, a thiol, a sulfoxide and/or a thiolate. The organic compound may comprise bis(3-sulfopropyl)-disodium-sulfoxide and/or mercaptopropyl sulfoxide.

The treatment liquid may be free or essentially free of suppressor. The concentration of suppressor(s) in the treatment liquid may be less than 0.01 mmoldm$^{-3}$. The treatment liquid may be free or essentially free of polyethers, which may be as herein described. The concentration of polyether(s) in the treatment liquid may be less than 0.01 mmoldm$^{-3}$.

Electrolyte solutions that allow superconformal filling of recessed features generally always contain chloride or other halides. Halides generally function with the suppressor and it is believed they provide a means for enhanced suppressor adsorption (via Cu-halide bridges). It has been shown that chloride adsorbs at crystal and grain boundaries of a metal and affects the morphology of the copper.

The treatment liquid may be free or essentially free of halides. The treatment liquid may be free or essentially free of chloride. The concentration of halide(s) in the treatment liquid may be less than 0.01 mmoldm$^{-3}$. The present inventors have found that if the treatment liquid does not contain a halide (eg chloride) and the treatment liquid remains in the recessed feature(s) up to contact of the surface with an electrolyte (which does contain a halide), superconformal filling is again improved. This is believed to be because the initial concentration of the halide ions in the liquid within the recessed features is less than that of the surrounding bulk electrolyte solution. Hence, the adsorption of suppressor onto the lower sides and bottom of the aperture is slower than the adsorption on to the surface surrounding the recessed feature and upper sides of the recessed feature, and the superconformal filling is thus improved.

The conductive layer may be a seed layer, which may have been deposited on the surface of the dielectric substrate by vacuum deposition. Alternatively, the conductive layer may be a layer deposited by electrodeposition, atomic layer deposition or chemical vapour deposition. In some cases the seed layer may also be a barrier layer as in the case of Ta or Ru. Like Cu seeds Ta or Ru may be deposited via physical vapour deposition, chemical vapour deposition or atomic layer deposition.

The conductive layer may comprise copper or an alloy thereof, such as CuAl.

The dielectric substrate may comprise a layer of dielectric material. The dielectric substrate may comprise an oxide of silicon or a carbonated oxide of silicon (with hydrogen) or a polymer. The dielectric substrate may comprise silicon dioxide or carbonated silicon dioxide. The dielectric layer may be a porous layer.

Filling of the recessed feature(s) may be achieved by electrodeposition, which may, as described above, also be the process for depositing the conductive layer (eg seed layer). During electrodeposition the substrate is contacted with an electrolyte containing ions of the conductive material. A charge is then passed through the substrate and electrolyte in a conventional manner. The electrolyte solution may comprise water.

The electrolyte solution may contain ions of a metal, which may be copper. The electrolyte solution may contain copper sulphate. Copper sulphate may be present in the electrolyte solution in a concentration of from 0.2 to 2 M, preferably from 0.6 to 1 M.

The electrolyte solution may comprise one or more additives. These are generally added to modify and control the properties of the electrodeposited material and its distribution on the micro and macro scales. The exact mechanism by which many additives affect the electrodeposition process is not fully understood, but it is accepted that they play an important role in the nature of the distribution. This may, for instance, be in the colour and lustre of the electrodeposited layer or in its roughness.

The electrolyte solution may comprise an acid, which may be sulphuric acid, which can aid conductivity. The acid may be present in the conductivity solution in a concentration of from 0.0001 to 2 M, preferably from 0.0003 to 0.1 M.

The electrolyte solution will generally comprise chloride ions, the role of which was discussed above. The concentration of chloride ions in the electrolyte solution may be from 10 to 150 ppm, preferably from 40 to 100 ppm.

The electrolyte solution may comprise one or more suppressors. The suppressor may comprise one or more polyethers such as, for example, polyethylene glycol, polypropylene glycol or copolymers of polyethylene oxide and polypropylene oxide. The concentration of suppressor in the electrolyte solution may be from 10 to 1000 ppm, preferably from 50 to 500 ppm. The molecular weight of the suppressor may be from 500 to 20000 g/mol.

The electrolyte solution may comprise an accelerator. The accelerator may comprise one or more organic compounds comprising sulphur. The organic compound comprising sulphur may be selected from disulphide, a mercaptan, a thiol, a sulphoxide and/or a thiolate. The accelerator may be selected from bis(3-sulphopropyl)-disodium-sulphoxide (SPS) and/or mercapto sulphoxide (MPS). The electrolyte solution may comprise from 0.01 to 5 w/v % of accelerator, more preferably from 0.1 to 1 w/v % of accelerator 1-1000 ppm.

The electrolyte solution may contain a nitrogen-containing compound. The nitrogen-containing compound may be selected from one or more of thiourea, benzotriazole and Janus Green B. These compounds act as grain refiners and improve the lustre of the electrodeposited layer.

The electrolyte solution may contain a leveller. The leveller may be a cationic polymer with amine/imine functional groups. Levellers are well known to the skilled person.

Although polyethers are generally considered to improve wetability and are considered surfactants in a general sense, the electrolyte solution may contain other surfactants specifically added to improve wetting. Examples of other surfactants include anionic surfactants, non-polyether non-ionic surfactants and cationic surfactants, such as cationic polyalkenes. Other non-ionic surfactants may comprise t-octylphenoxypolyethoxy-ethanol (sold under the trade name Triton X100) or tetra-functional block copolymers based on ethylene oxide and propylene sold under the brand name "Tetronic 1301 Surfactant" by BASF.

The process of the present invention will now be further described in the following non-limiting Example.

EXAMPLE

A semiconductor wafer comprising a silicon dioxide layer was presented for pre-treatment immediately following metal 2 (or the second metal level, or the first dual damascene level) physical vapour deposition of a barrier and seed layer of copper. The wafer surface after the barrier and seed layers had trenches and vias of approximately 100 nm wide with aspect ratios of approximately 2 to 5. The wafer was loaded onto an electroplating tool, on which it was transferred to a pre-rinse station, where it was rotated at 60 rpm. In the prerinse station, a small stream of deionised water solution was first applied to the centre of the rotating wafer (rotation speed of approximately 200 rpm) for a few seconds. The water flowed over the surface of the wafer and was forced outwards by the rotation. In a first test, the wafer remained wet and in a second test, the wafer was spun-dried before the pre-plating solution was applied. The pre-plating solution contained 100 ppm of SPS in a solution of 10 g/l $CuSO_4$ in a slightly acidic (buffered pH 6.5) solution. The solution was applied by spraying it through a nozzle to the centre of the wafer surface for 3 s while the wafer is rotating (rotation speed of approximately 200 rpm). The wafer rotation was slowed to prevent drying and spraying of the pre-rinse solution on to the wafer was stopped. A robot arm took the wafer immediately from the pre-rinse station to the cell for electrodeposition. In the plating cell the wafer was immersed in the plating solution. The plating solution contained 1 M sulphuric acid, 0.1 M copper sulphate, hydrogen chloride, and organic additives (accelerator, suppressor, and leveller, all <1000 ppm each) with the initial application of controlled voltage (approximately 2V cross-cell potentiostatic "hot entry") followed by three steps controlled current of 4 A, 8 A, then 30 A (galvanostatic) for a period of approximately 30 seconds per step. After the wafer had been plated, it was moved to a post-plating rinse station and the edge bead was removed by applying an etching solution to the edge of the wafer as the wafer is rotated. A small nozzle was directed to the edge of the wafer and the copper 3 mm from the edge was etched using an aqueous solution containing 1M sulphuric acid and 0.1M hydrogen peroxide. Following the post-rinse and edge bead removal, the wafer was spun at a rotation speed of approximately 2000 rpm until it was dry. The wafer was then removed from the tool and subjected to chemical mechanical polishing (CMP).

In the CMP process, the wafer is typically placed face down within a head capable of applying downward pressure and rotating. The wafer may be rinsed or cleaned before it is applied to a rotating platen in the presence of a slurry. The slurry typically includes particles, oxidizing agents, complexing agents, inhibitors and promotes planarization (uniform removal of copper) of the wafers surface. The process may include transferring the wafer to a second or third platen when another slurry is used to improve planarization. Other slurries and processes may be optimized to remove Cu or improve planarity after the dielectric layer (including barrier, or capping dielectric) is exposed.

The wafer was analysed using cross section SEM and it was apparent that the electrodeposition of the copper had proceeded in a conformal manner. Few, if any, defects within the recessed features having a diameter of less than nm could be detected. No difference was observed in the number of defects formed in the first or second test.

The invention claimed is:

1. A process for filling recessed features of a dielectric substrate for a semiconductor device, the process comprising the steps of:
   (a) providing a dielectric substrate having a recessed feature in a surface thereof, wherein the smallest dimension (width) across said feature is less than or equal to 200 nm, a conductive layer being present on at least a portion of said surface,
   (b) prior to electrodeposition of a conductive material, contacting the surface of the substrate with a treatment liquid containing an accelerator, and, without subsequent drying of the substrate,
   (c) contacting the surface of the substrate with an electrolyte solution, which is different from the treatment liquid, and filling the feature with the conductive material by carrying out an electrodeposition of the conductive material onto the surface of the substrate.

2. A process as claimed in claim 1, wherein the conductive material comprises a metal or alloy including copper or an alloy comprising copper.

3. A process as claimed in claim 1, wherein the accelerator comprises an organic compound containing sulphur, including one or more of a disulfide, a mercaptan, a thiol, a sulfoxide and/or a thiolate.

4. A process as claimed in claim 3, wherein the organic compound comprises bis(3-sulfopropyl)-disodium-sulfoxide and/or mercaptopropyl sulfoxide.

5. A process as claimed in claim 1, wherein the treatment liquid has a concentration of halides of less than 0.01 mmoldm$^{-3}$.

6. A process as claimed in claim 1, wherein the treatment liquid further comprises one or more of a leveller, a non-polyether surfactant, an acid, a base, a complexing agent and a copper compound.

7. A process as claimed in claim 6, wherein the leveller comprises a cationic polymer with amine and/or imine functional groups.

8. A process as claimed in claim 6, wherein the acid comprises sulphuric acid.

9. A process as claimed in claim 6, wherein the base comprises ammonium hydroxide.

10. A process as claimed in claim 6, wherein the complexing agent comprises one or more of EDTA, a pyrophosphate, an organic acid, or a salt thereof.

11. A process as claimed in claim 1, wherein the treatment liquid further comprises a base and a complexing agent.

12. A process as claimed in claim 1, wherein a temperature of the treatment liquid during step (b) is from 5 to 95° C.

13. A process as claimed in claim 1, wherein the treatment liquid is an aqueous solution containing the accelerator.

14. A process as claimed in claim 1, wherein the concentration of the accelerator in the treatment liquid is from 0.01 to 5 w/v %.

15. A process as claimed in claim 1, wherein the conductive layer is a seed layer.

16. A process as claimed in claim 1, wherein the conductive layer is a layer formed by vacuum deposition or electrodeposition.

17. A process as claimed in claim 1, wherein the conductive layer comprises copper or an alloy of copper.

18. A process as claimed in claim 1, wherein the dielectric substrate comprises an oxide of silicon or a carbonated oxide of silicon.

19. A process as claimed in claim 1, wherein said recessed feature is filled in a superconformal manner.

20. A process for filling recessed features of a dielectric substrate for a semiconductor device, the process comprising the steps of:
  (a) providing a dielectric substrate having a recessed feature in a surface thereof, wherein the smallest dimension (width) across said feature is less than or equal to 200 nm, a conductive layer being present on at least a portion of said surface,
  (b) prior to electrodeposition of a conductive material, contacting the surface of the substrate with a treatment liquid containing an accelerator and less than 0.01 mmoldm$^{-3}$ halides, the accelerator comprising an organic compound including one or more of a disulfide, a mercaptan, a thiol, a sulfoxide and/or a thiolate, and, without subsequent drying of the substrate,
  (c) contacting the surface of the substrate with an electrolyte solution, which is different from the treatment liquid, and filling the feature with the conductive material by carrying out an electrodeposition of the conductive material onto the surface of the substrate.

21. A process for filling recessed features of a dielectric substrate for a semiconductor device, the process comprising the steps of:
  (a) providing a dielectric substrate having a recessed feature in a surface thereof, wherein the smallest dimension (width) across said feature is less than or equal to 200 nm, a conductive layer being present on at least a portion of said surface,
  (b) treating the surface of the substrate with a treatment liquid prior to electrodeposition of a conductive material over the conductive layer, the treatment liquid containing an accelerator, and, without subsequent drying of the substrate,
  (c) electrodepositing the conductive material onto the surface of the substrate in the presence of an electrolyte solution that is different from the treatment liquid, electrodepositing filling the feature with the conductive material.

* * * * *